United States Patent
Chin

(10) Patent No.: US 8,138,017 B2
(45) Date of Patent: *Mar. 20, 2012

(54) INTEGRATED CIRCUIT PACKAGE SYSTEM WITH THROUGH SEMICONDUCTOR VIAS AND METHOD OF MANUFACTURE THEREOF

(75) Inventor: Chee Keong Chin, Hsin-Chiu Hsien (TW)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/974,866

(22) Filed: Dec. 21, 2010

(65) Prior Publication Data

US 2011/0095439 A1    Apr. 28, 2011

Related U.S. Application Data

(63) Continuation of application No. 12/562,702, filed on Sep. 18, 2009, now Pat. No. 7,867,821.

(51) Int. Cl.
*H01L 21/00* (2006.01)
(52) U.S. Cl. ............... 438/107; 438/109; 257/E21.508
(58) Field of Classification Search ............... 257/E21.5, 257/E21.512
See application file for complete search history.

(56) References Cited

U.S. PATENT DOCUMENTS

| | | |
|---|---|---|
| 6,369,448 B1 | 4/2002 | McCormick |
| 7,122,906 B2 | 10/2006 | Doan |
| 7,279,795 B2 | 10/2007 | Periaman et al. |
| 7,531,905 B2 | 5/2009 | Ishino et al. |
| 7,547,630 B2 | 6/2009 | Gerber |
| 7,553,752 B2 | 6/2009 | Kuan et al. |
| 7,867,821 B1 * | 1/2011 | Chin ............... 438/107 |
| 2007/0072341 A1 | 3/2007 | Tai et al. |
| 2007/0152313 A1 | 7/2007 | Periaman et al. |
| 2008/0237310 A1 | 10/2008 | Periaman et al. |
| 2008/0272465 A1 | 11/2008 | Do et al. |
| 2008/0277800 A1 | 11/2008 | Hwang et al. |
| 2008/0302560 A1 | 12/2008 | Tanno et al. |

* cited by examiner

Primary Examiner — Cheung Lee
(74) Attorney, Agent, or Firm — Mikio Ishimaru

(57) ABSTRACT

A method of manufacture of an integrated circuit package system includes: providing a package substrate; mounting a first integrated circuit die, having through silicon vias, on the package substrate; coupling cylindrical studs to the package substrate adjacent to the first integrated circuit die; and mounting a second integrated circuit die, having through silicon vias, on the first integrated circuit die and the cylindrical studs for forming an electrical connection among the second integrated circuit die, the first integrated circuit die, the package substrate, or a combination thereof.

17 Claims, 2 Drawing Sheets

INTEGRATED CIRCUIT PACKAGE SYSTEM WITH THROUGH SEMICONDUCTOR VIAS AND METHOD OF MANUFACTURE THEREOF

CROSS-REFERENCE TO RELATED APPLICATION(S)

This is a continuation of U.S. patent application Ser. No. 12/562,702 filed Sep. 18, 2009, now U.S. Pat. No. 7,867,821.

TECHNICAL FIELD

The present invention relates generally to an integrated circuit package system, and more particularly to a system for forming a multi-chip package having through semiconductor vias in a stack.

BACKGROUND ART

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through semiconductor vias. The through semiconductor vias extend through the substrate thereby allowing electrical interconnections between circuits on various chips. Through semiconductor via interconnections can provide advantages in terms of interconnect density compared to other technologies. However, introduction of such interconnects may introduce additional challenges.

The integration of chips in 3D brings-forth a number of new challenges that need to be addressed. Hence, what is needed in the art are improved structures and methods of producing structures for 3D chip integration.

Thus, a need still remains for an integrated circuit package system with through semiconductor vias that can assist in the package shrinking process. In view of the ever-increasing process of functional conversion and the consumer demand for high quality and physically small devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a package substrate; mounting a first integrated circuit die, having through silicon vias, on the package substrate; coupling cylindrical studs to the package substrate adjacent to the first integrated circuit die; and mounting a second integrated circuit die, having through silicon vias, on the first integrated circuit die and the cylindrical studs for forming an electrical connection among the second integrated circuit die, the first integrated circuit die, the package substrate, or a combination thereof.

The present invention provides an integrated circuit package system including: a package substrate; a first integrated circuit die, having through silicon vias, mounted on the package substrate; cylindrical studs coupled to the package substrate adjacent to the first integrated circuit die; and a second integrated circuit die, having through silicon vias, mounted on the first integrated circuit die and the cylindrical studs provides an electrical connection among the second integrated circuit die, the first integrated circuit die, the package substrate, or a combination thereof.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
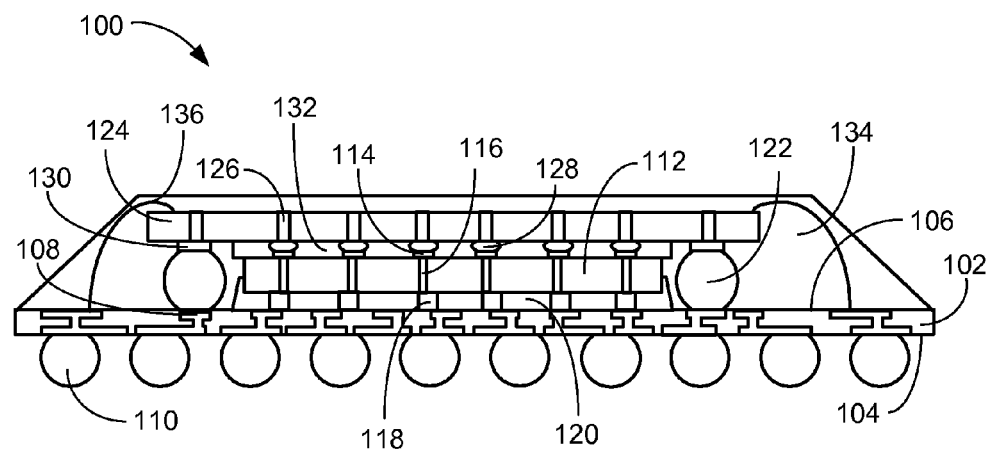
FIG. 1 is a cross-sectional view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The cross-sectional view of the integrated circuit package system 100 depicts a package substrate 102 having a system side 104 and a component side 106. A component pad 108 may be coupled through the package substrate 102 to a system interconnect 110, which may be used to electrically connect the integrated circuit package system 100 to the next level system such as a printed circuit board, not shown.

A first integrated circuit die 112 having an active side contact 114 and a through silicon via 116 may be mounted on the component side 106. The active side contact 114 can be formed on and extend above the through silicon via 116. The through silicon via 116 makes the interface signals from the active side contact 114 available on the back side of the first integrated circuit die 112. The through silicon via 116 may be coupled to the component pad 108 by a chip interconnect 118, such as a solder bump, solder ball, solder column, or stud bump. The position of the active side contact 114 is an example only and the active side of the first integrated circuit die 112 may be either toward or away from the component side 106.

An adhesive layer 120, such as a preformed underfill material or a film lamination type of underfill material, may be applied between the first integrated circuit die 112 and the component side 106 of the package substrate 102. The chip interconnect 118 may be captive in the adhesive layer 120 and applied as a unit to simplify the manufacturing process.

Cylindrical studs 122, such as solder balls of a specific size, may be applied to the component pad 108 directly adjacent to the first integrated circuit die 112. The cylindrical stud 122 may be of a sufficient size to extend slightly above the first integrated circuit die 112 and be substantially the same height as the active side contact 114.

A second integrated circuit die 124, having through silicon vias 126 and chip contacts 128, may be mounted on the active side contacts 114 of the first integrated circuit die 112. Cylindrical stud contacts 130 may be coupled between the through silicon vias 126, of the second integrated circuit die 124, and the cylindrical stud 122 in order to form an electrical connection between the second integrated circuit die 124 and the system interconnect 110, without impacting the first integrated circuit die 112.

The chip contacts 128 may be coupled to the active side or the back side of the second integrated circuit die 124, as the through silicon vias 126 provide the interface signals to both sides. A second adhesive layer 132, such as a preformed underfill material or a film lamination type of underfill material, may be applied in a non-flow process by either being applied to the second integrated circuit die 124 prior to assembly or by a film lamination process during assembly.

A molded package body 134, such as an epoxy molding compound, may optionally be formed on the component side 106 of the package substrate 102, the cylindrical studs 122, the first integrated circuit die 112, and the second integrated circuit die 124. A bond wire 136 may optionally couple the second integrated circuit die 124 to the component pad 108 in order to form additional signal connections between the system interconnects 110 and the second integrated circuit die 124 without impacting the first integrated circuit die 112.

It has been discovered that the application of the cylindrical studs 122 adjacent to the first integrated circuit die 112 may provide additional interface capabilities for supporting a larger size of the second integrated circuit die 124. The attachment of a single row of the cylindrical studs 122 is an example only and multiple rows of the cylindrical studs 122 are possible. The cylindrical studs 122 may be larger than standard solder balls and their method of application, a ball drop process, allows the cylindrical stud 122, of a specific size, to be precisely positioned on the package substrate 102.

Figure 2:
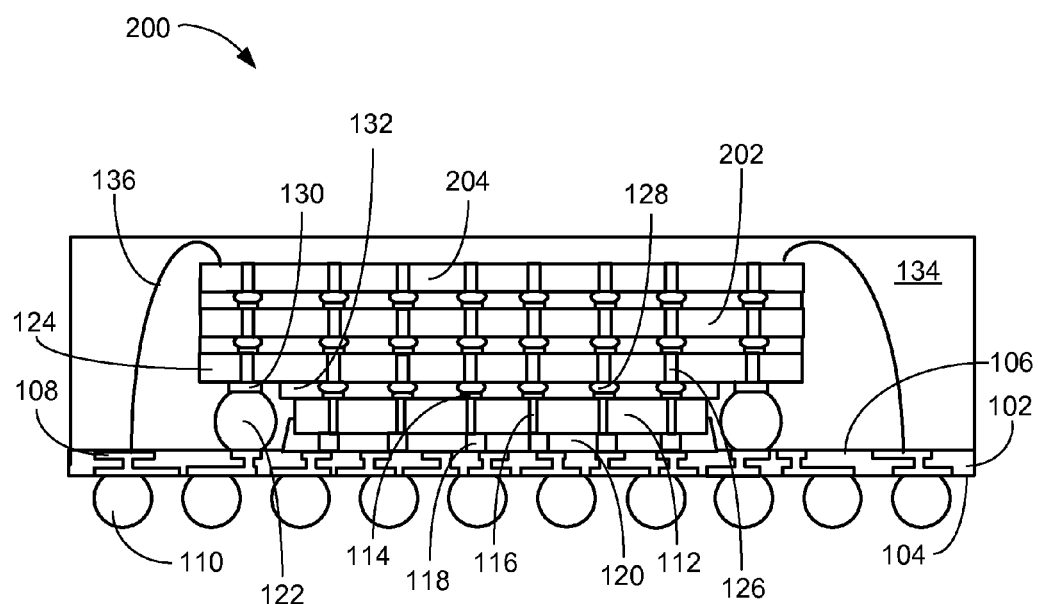
FIG. 2 is a cross-sectional view of an integrated circuit package system in a first alternative embodiment of the present invention.

Referring now to FIG. 2, therein is shown a cross-sectional view of an integrated circuit package system 200 in a first alternative embodiment of the present invention. The cross-sectional view of the integrated circuit package system 200 depicts the package substrate 102 having the system side 104 and the component side 106. The component pad 108 may be coupled through the package substrate 102 to the system interconnect 110, which may be used to electrically connect the integrated circuit package system 200 to the next level system such as the printed circuit board, not shown.

The first integrated circuit die 112 having the active side contact 114 and the through silicon via 116 may be mounted on the component side 106. The through silicon via 116 makes the interface signals from the active side contact 114 available on the back side of the first integrated circuit die 112. The through silicon via 116 may be coupled to the component contact by the chip interconnect 118, such as a solder bump, solder ball, solder column, or stud bump. The position of the active side contact 114 is an example only and the active side of the first integrated circuit die 112 may be either toward or away from the component side 106.

The cylindrical studs 122, such as solder balls of a specific size, may be applied to the component pad 108 directly adjacent to the first integrated circuit die 112. The cylindrical stud 122 may be of a sufficient size to extend slightly above the first integrated circuit die 112 and be substantially the same height as the active side contact 114.

The second integrated circuit die 124, having the through silicon vias 126 and the chip contacts 128, may be mounted on the active side contacts 114 of the first integrated circuit die 112. The cylindrical stud contacts 130 may be coupled between the through silicon vias 126, of the second integrated circuit die 124, and the cylindrical stud 122 in order to form an electrical connection between the second integrated circuit die 124 and the system interconnect 110, without impacting the first integrated circuit die 112.

The chip contacts 128 may be coupled to the active side or the back side of the second integrated circuit die 124, as the through silicon vias 126 provide the interface signals to both sides. The second adhesive layer 132, such as an underfill material, may be applied in a non-flow process by either being applied to the second integrated circuit die 124 prior to assembly or by a film lamination process.

A third integrated circuit die 202, having the through silicon vias 126, may be mounted on and electrically connected to the second integrated circuit die 124. The chip contacts 128 of the third integrated circuit die 202 may be coupled to the active side contacts 114 of the second integrated circuit die 124 in order to provide a high speed interface between the two integrated circuits.

A fourth integrated circuit die 204, having the through silicon vias 126, may be mounted on and electrically connected to the third integrated circuit die 202. The chip contacts 128 of the fourth integrated circuit die 204 may be coupled to the active side contacts 114 of the third integrated circuit die 202 in order to provide a high speed interface between the two integrated circuits.

The molded package body 134, such as an epoxy molding compound, may optionally be formed on the component side 106 of the package substrate 102, the cylindrical studs 122, the first integrated circuit die 112, the second integrated circuit die 124, the third integrated circuit die 202 and the fourth integrated circuit die 204. The bond wire 136 may optionally couple the fourth integrated circuit die 204 to the component pad 108 in order to form additional signal connections between the system interconnects 110 and the fourth integrated circuit die 204 without impacting the first integrated circuit die 112, the second integrated circuit die 124, or the third integrated circuit die 202.

It has been discovered that by providing high speed electrical interconnects between the integrated circuit die of the present invention may also provide an efficient thermal path throughout the stack by thermally coupling the through silicon vias to the package substrate. This allows improved reliability for the integrated circuit die in the middle of the stack by reducing the average temperature.

Figure 3:
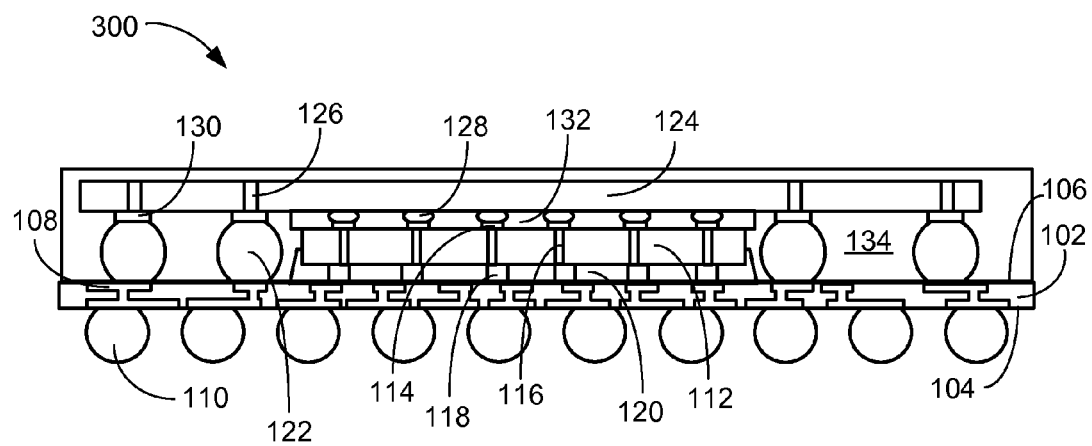
FIG. 3 is a cross-sectional view of an integrated circuit package system in a second alternative embodiment of the present invention.

Referring now to FIG. 3, therein is shown a cross-sectional view of an integrated circuit package system 300 in a second alternative embodiment of the present invention. The cross-sectional view of the integrated circuit package system 300 depicts the package substrate 102 having the system side 104 and the component side 106. The component pad 108 may be coupled through the package substrate 102 to the system interconnect 110, which may be used to electrically connect the integrated circuit package system 200 to the next level system such as the printed circuit board, not shown.

The first integrated circuit die 112 having the active side contact 114 and the through silicon via 116 may be mounted on the component side 106. The through silicon via 116 makes the interface signals from the active side contact 114 available on the back side of the first integrated circuit die 112. The through silicon via 116 may be coupled to the component contact by the chip interconnect 118, such as a solder bump, solder ball, solder column, or stud bump. The position of the active side contact 114 is an example only and the active side of the first integrated circuit die 112 may be either toward or away from the component side 106.

The cylindrical studs 122, such as solder balls of a specific size, may be applied to the component pad 108 directly adjacent to the first integrated circuit die 112. The cylindrical stud 122 may be of a sufficient size to extend slightly above the first integrated circuit die 112 and be substantially the same height as the active side contact 114.

The second integrated circuit die 124, having the through silicon vias 126 and the chip contacts 128, may be mounted on the active side contacts 114 of the first integrated circuit die 112 in an active side to active side configuration. The cylindrical stud contacts 130 may be coupled between the through silicon vias 126, of the second integrated circuit die 124, and the cylindrical stud 122 in order to form an electrical connection between the second integrated circuit die 124 and the system interconnect 110, without impacting the first integrated circuit die 112.

The second integrated circuit die 124 may be much larger than the first integrated circuit die 112. In this case, additional rows of the cylindrical stud 122 may be provided to support the second integrated circuit die 124 and provide electrical connections to the component pads 108. The present invention is shown having two rows of the cylindrical studs 122, but this is an example only and any number of rows of the cylindrical studs 122 may be applied as required.

Figure 4:
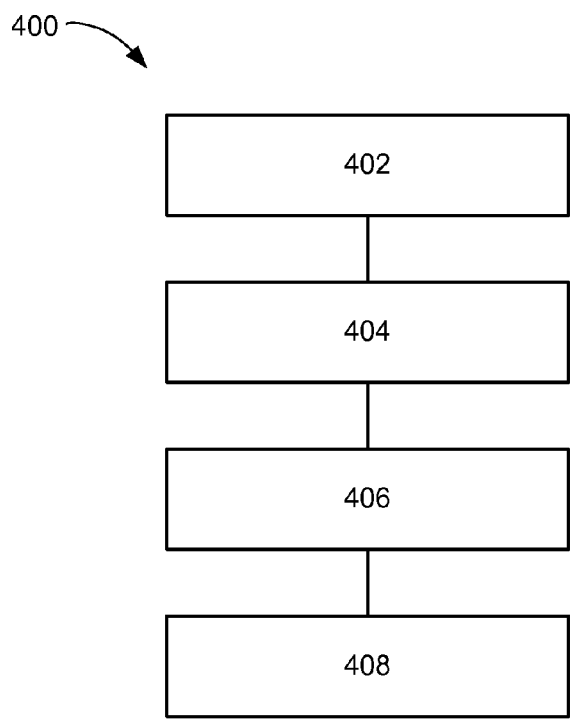
FIG. 4 is a flow chart of a method of manufacture of an integrated circuit package system in an embodiment of the present invention.

Referring now to FIG. 4, therein is shown a flow chart of a method 400 of manufacture of an integrated circuit package system in an embodiment of the present invention. The method 400 includes: providing a package substrate in a block 402; mounting a first integrated circuit die, having through silicon vias, on the package substrate in a block 404; coupling cylindrical studs to the package substrate adjacent to the first integrated circuit die in a block 406; and mounting a second integrated circuit die, having through silicon vias, on the first integrated circuit die and the cylindrical studs for forming an electrical connection among the second integrated circuit die, the first integrated circuit die, the package substrate, or a combination thereof in a block 408.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a package substrate;
   mounting a first integrated circuit die, having through silicon vias and active side contacts, on the package substrate, the active side contacts on and extending above the through silicon vias;
   coupling cylindrical studs to the package substrate adjacent to the first integrated circuit die, the cylindrical studs the same height as the active side contacts; and
   mounting a second integrated circuit die, having through silicon vias, on the first integrated circuit die and the cylindrical studs for forming an electrical connection among the second integrated circuit die, the first integrated circuit die, the package substrate, or a combination thereof.

2. The method as claimed in claim 1 further comprising coupling chip contacts, on the second integrated circuit die, to the active side contacts, on the first integrated circuit die, for forming the electrical connection.

3. The method as claimed in claim 1 further comprising applying an adhesive between the first integrated circuit die and the second integrated circuit die.

4. The method as claimed in claim 1 further comprising:
coupling bond wires between the package substrate and the second integrated circuit die; and
forming a molded package body on the package substrate, the first integrated circuit die, the cylindrical studs, the second integrated circuit die, and the bond wires.

5. A method of manufacture of an integrated circuit package system comprising:
providing a package substrate having a component side and a system side;
mounting a first integrated circuit die, having through silicon vias and active side contacts, on the package substrate including coupling a chip interconnect between the through silicon via and the component side of the package substrate, the active side contacts on and extending above the through silicon vias;
coupling cylindrical studs to the package substrate adjacent to the first integrated circuit die including performing a ball drop process for positioning the cylindrical studs of a specific size, the cylindrical studs the same height as the active side contacts; and
mounting a second integrated circuit die, having through silicon vias, on the first integrated circuit die and the cylindrical studs for forming an electrical connection among the second integrated circuit die, the first integrated circuit die, the package substrate, or a combination thereof including forming system contacts on the system side of the package substrate coupled to the electrical connection.

6. The method as claimed in claim 5 further comprising providing chip contacts on the second integrated circuit die and to the active side contacts on the first integrated circuit die for forming the electrical connection including forming a thermal path by the through silicon vias thermally coupled to the package substrate.

7. The method as claimed in claim 5 further comprising applying an adhesive between the first integrated circuit die and the second integrated circuit die including applying a preformed underfill material or a film lamination type of underfill material.

8. The method as claimed in claim 5 further comprising:
coupling bond wires between the package substrate and the second integrated circuit die including bonding to a component pad coupled to the system contact through the package substrate; and
forming a molded package body on the package substrate, the first integrated circuit die, the cylindrical studs, the second integrated circuit die, and the bond wires; and
wherein:
coupling the cylindrical studs to the package substrate includes coupling more than one row of the cylindrical studs.

9. An integrated circuit package system comprising:
a package substrate;
a first integrated circuit die, having through silicon, vias and active side contacts, mounted on the package substrate, the active side contacts on and extending above the through silicon vias;
cylindrical studs coupled to the package substrate adjacent to the first integrated circuit die, the cylindrical studs the same height as the active side contacts; and
a second integrated circuit die, having through silicon vias, mounted on the first integrated circuit die and the cylindrical studs provide an electrical connection among the second integrated circuit die, the first integrated circuit die, the package substrate, or a combination thereof.

10. The system as claimed in claim 9 further comprising chip contacts, on the second integrated circuit die, coupled to the active side contacts, on the first integrated circuit die, provide the electrical connection.

11. The system as claimed in claim 9 further comprising an adhesive between the first integrated circuit die and the second integrated circuit die.

12. The system as claimed in claim 9 further comprising:
bond wires between the package substrate and the second integrated circuit die; and
a molded package body on the package substrate, the first integrated circuit die, the cylindrical studs, the second integrated circuit die, and the bond wires.

13. The system as claimed in claim 9 further comprising:
a component side and a system side on the package substrate;
a chip interconnect between the through silicon via, of the first integrated circuit die, and the component side of the package substrate; and
system contacts on the system side of the package substrate coupled to the electrical connection;
wherein:
the cylindrical studs coupled adjacent to the first integrated circuit die includes a specific size cylindrical stud.

14. The system as claimed in claim 13 further comprising chip contacts on the second integrated circuit die coupled to the active side contacts on the first integrated circuit die to provide the electrical connection includes a thermal path formed by the through silicon vias thermally coupled to the package substrate.

15. The system as claimed in claim 13 further comprising a cylindrical stud contact, attached to the through silicon via, on the second integrated circuit die, coupled to the cylindrical studs includes a component pad, on the component side of the package substrate, coupled through the cylindrical stud.

16. The system as claimed in claim 13 further comprising an adhesive between the first integrated circuit die and the second integrated circuit die includes a preformed underfill material or a film lamination type of underfill material applied.

17. The system as claimed in claim 13 further comprising:
bond wires between the package substrate and the second integrated circuit die include a component pad coupled to the system contact through the package substrate; and
a molded package body on the package substrate, the first integrated circuit die, the cylindrical studs, the second integrated circuit die, and the bond wires; and
wherein:
the cylindrical studs coupled to the package substrate includes more than one row of the cylindrical studs coupled to the package substrate.

* * * * *

UNITED STATES PATENT AND TRADEMARK OFFICE
CERTIFICATE OF CORRECTION

| | | |
|---|---|---|
| PATENT NO. | : 8,138,017 B2 | Page 1 of 1 |
| APPLICATION NO. | : 12/974866 | |
| DATED | : March 20, 2012 | |
| INVENTOR(S) | : Chin | |

It is certified that error appears in the above-identified patent and that said Letters Patent is hereby corrected as shown below:

<u>Column 7:</u> claim 9, line 58, delete "through silicon, vias" and insert therefor --through silicon vias--

Signed and Sealed this
Twenty-fifth Day of September, 2012

David J. Kappos
*Director of the United States Patent and Trademark Office*